United States Patent
Sato et al.

(10) Patent No.: US 7,235,490 B2
(45) Date of Patent: Jun. 26, 2007

(54) METHOD OF MANUFACTURING SEMICONDUCTOR DEVICE

(75) Inventors: Yasuhiko Sato, Yokosuka (JP); Seiji Nakagawa, Danbury, CT (US); Jun Idebuchi, Yokohama (JP); Motoya Kishida, Yokohama (JP); Shuichi Taniguchi, Yokohama (JP); Tsuyoshi Shibata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 150 days.

(21) Appl. No.: 10/788,216

(22) Filed: Feb. 27, 2004

(65) Prior Publication Data
US 2004/0224512 A1   Nov. 11, 2004

(30) Foreign Application Priority Data
Feb. 28, 2003   (JP)   ............................. 2003-053182

(51) Int. Cl.
   *H01L 21/311*   (2006.01)
(52) U.S. Cl. ................ 438/700; 438/706; 438/725
(58) Field of Classification Search ............... None
   See application file for complete search history.

(56) References Cited

U.S. PATENT DOCUMENTS

| | | | | |
|---|---|---|---|---|
| 5,442,237 | A | * | 8/1995 | Hughes et al. ........... 257/759 |
| 5,549,935 | A | * | 8/1996 | Nguyen et al. .......... 427/490 |
| 5,886,920 | A | * | 3/1999 | Marshall et al. ........ 365/145 |
| 6,150,258 | A | * | 11/2000 | Mountsier et al. ....... 438/623 |
| 6,184,572 | B1 | * | 2/2001 | Mountsier et al. ....... 257/637 |
| 6,420,271 | B2 | | 7/2002 | Sato et al. |
| 6,576,562 | B2 | | 6/2003 | Ohuchi et al. |
| 6,713,873 | B1 | * | 3/2004 | O'Loughlin et al. ..... 257/758 |
| 2001/0034131 | A1 | * | 10/2001 | Sato et al. ............ 438/700 |

FOREIGN PATENT DOCUMENTS

| | | |
|---|---|---|
| JP | 01-309054 | 12/1989 |
| JP | 09-244249 | 9/1997 |
| JP | 10-041213 | 2/1998 |
| JP | 2001-272797 | 10/2001 |
| JP | 2002-270584 | 9/2002 |
| JP | 2002-305187 | 10/2002 |
| JP | 2002-343767 | 11/2002 |

OTHER PUBLICATIONS

Office Action Mailed Jul. 25, 2006, Japanese Patent Application No. 2003-053182.
English Translation of Office Action Mailed Jul. 25, 2006, Japanese Patent Application No. 2003-053182.
English Language Abstract of JP 01-309054, no date.
English Language Derwent Abstact of JP 10-041213, no date.
English Language Derwent Abstract of JP 2002-270584.

* cited by examiner

*Primary Examiner*—Duy-Vu N. Deo
(74) *Attorney, Agent, or Firm*—Finnegan, Henderson, Farabow, Garrett & Dunner, L.L.P.

(57) ABSTRACT

A method of manufacturing a semiconductor device comprises preparing a working film to be processed, forming an adhesion improving region on the working film for increasing an adhesion between the working film and a mask material containing carbon, forming the mask material on the working film, forming a resist pattern on the mask material, the mask material having a higher etching resistance for the working film than the resist pattern, transferring the pattern of the resist pattern onto the mask material, and etching the working film by using the mask material as a mask.

13 Claims, 4 Drawing Sheets

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2003-053182, filed Feb. 28, 2003, the entire contents of which are incorporated herein by reference.

BACKGROUND OF THE INVENTION

1. Field of the Invention

The present invention relates to a method of manufacturing a semiconductor device, particularly, to a method of manufacturing a semiconductor device comprising a step of forming a pattern on a working film to be processed by using a mask material and a resist pattern.

2. Description of the Related Art

In the manufacturing method of a semiconductor device, a series of process steps comprising a step of depositing a film to be processed on a silicon wafer and q step of patterning the deposited film in a desired pattern are repeatedly carried out. In patterning the deposited film, a resist film is formed by depositing a photosensitive substance, which is generally called a resist, on the deposited film, followed by exposing a predetermined region of the resist film to light. Then, the light-exposed portion or the unexposed portion of the resist film is removed by a developing treatment so as to form a resist pattern. Further, the film to be processed is subjected to a dry etching with the resist pattern used as a mask so as to obtain a pattern of a desired shape.

An ultraviolet light such as a KrF excimer laser or an ArF excimer laser is used as the light source in the light exposure process in view of the throughput. However, since the required resolution has been rendered smaller than the wavelength of the exposing light in accordance with miniaturization of the LSI, the latitudes in the light exposure process such as the exposure latitude and the focus latitude have become insufficient.

In order to make up for these process margins, it is effective to decrease the thickness of the resist film for improving the resolution. In this case, however, a new problem is generated that it is impossible to ensure the thickness of the resist film required for the etching of the film to be processed.

To overcome the problems pointed out above, a pattern transfer process is proposed in, for example, Japanese Patent Disclosure (Kokai) No. 2001-272797 and Japanese Patent Disclosure No. 2002-305187. To be more specific, it is proposed that a mask material and a resist film, which are resistant to etching, are formed successively on the film to be processed, followed by applying a light exposure treatment and, then, a developing treatment to the resist film so as to form a resist pattern. Further, the film to be processed is patterned by using as an etching mask a mask material pattern obtained by transferring the pattern of the resist pattern to the mask material.

According to the method proposed in the prior art quoted above, it is possible to pattern the film to be processed with a high accuracy even if the thickness of the resist film is decreased such that the resist pattern disappears during the etching process because the mask material pattern is resistant to the etching during the etching process of the film to be processed.

It is desirable for the mask material to be provided by a material that can be formed into a film by a coating method because the process cost is low. It is also desirable for the mask material film to be peeled easily with oxygen ashing. An organic material containing a large number of carbon atoms, which is unlikely to be sputtered and resistant to the etching, is used as such a mask material.

However, in the case of using an organic material, particularly, an organic material having a high carbon content, the mask material pattern is ruptured during the etching process of the film to be processed, with the result that it is difficult to transfer the pattern of the resist pattern onto the film to be processed.

BRIEF SUMMARY OF THE INVENTION

A method of manufacturing a semiconductor device according to an aspect of the present invention comprises preparing a working film to be processed; forming an adhesion improving region on the working film for increasing an adhesion between the working film and a mask material containing carbon; forming the mask material on the working film; forming a resist pattern on the mask material, the mask material having a higher etching resistance for the working film than the resist pattern; transferring the pattern of the resist pattern onto the mask material; and etching the working film by using the mask material as a mask.

DETAILED DESCRIPTION OF THE INVENTION

Some embodiments of the present invention will now be described with reference to the accompanying drawings.

(First Embodiment)

FIGS. 1A to 1H are cross sectional views showing a manufacturing process of a semiconductor device for the first embodiment of the present invention.

Figure 1A:
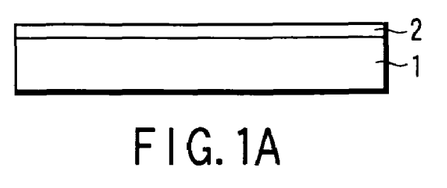
FIGS. 1A to 1H are cross sectional views showing a manufacturing process of a semiconductor device for a first embodiment of the present invention.

In the first step, an adhesion improving region 2 for improving the adhesion between a film 1 to be processed and a mask material is formed on the surface of the film 1 to be processed as shown in FIG. 1A in order to prevent a mask material pattern from being ruptured during the processing of the film 1 to be processed. The adhesion improving region 2 is formed by modifying a surface region of the film 1 or a film formed on the film 1.

The film 1 to be processed, which is not particularly limited, for example, a silicon oxide film, a silicon nitride film, a silicon oxynitride film, or a spin-on-glass film, a silicon series insulating film such as a film of a blank material used for the mask preparation, a silicon series semi-conductor film such as an amorphous silicon film, a polycrystalline silicon (polysilicon) film or a single crystalline silicon film, and a wiring material series conductive film such as an aluminum film, an aluminum silicide film, an aluminum titanium film, a copper film or a tungsten film. It is also possible to use a semiconductor substrate to be processed such as a silicon substrate in place of the film 1 to be processed.

In order to form the adhesion improving region 2, it is desirable to apply a modifying treatment to the film 1 to be processed for rendering the film 1 hydrophobic. The reason for the application of the modifying treatment is as follows.

In order to improve the resistance to the etching, it is necessary to increase the carbon content of the mask material used in the present embodiment. Therefore, the functional group having a polarity such as a carbonyl group, an ether group or a hydroxyl group is contained in a small amount in the mask material and, thus, the mask material is low in its hydrophobic nature. Such being the situation, if the hydrophobic nature on the surface of the film 1 to be processed is improved by the application of the modifying treatment, the polarities of the film 1 and the mask material are rendered close to each other so as to improve the adhesion.

It is desirable for the hydrophobic treatment, i.e., the modifying treatment to render the surface of the film 1 hydrophobic, to be carried out such that the surface of the film 1 forms a contact angle of at least 40° with pure water. If the contact angle is smaller than 40°, it is impossible to obtain a sufficient adhesion between the film 1 to be processed and the mask material, with the result that it is possible for the mask material pattern to be ruptured in the etching stage of the film 1 to be processed. It should be noted, however, that, if the contact angle is not smaller than 20°, the rupture of the mask material during the etching process is less likely to take place, compared with the case of employing the conventional technology. Such being the situation, it is possible to carry out the hydrophobic treatment such that the contact angle of the film 1 to be processed with the pure water is not smaller than 20° and smaller than 40°.

The hydrophobic treatment can be carried out by the method that the film 1 to be processed is exposed to an atmosphere of a silane coupling agent such as hexamethyl disilazane so as to substitute a functional group having a high hydrophobic nature such as a methyl group for the hydroxyl group on the surface of the film 1 to be processed, or by the modifying method that the film 1 to be processed is dipped in a chemical solution containing fluorine such as hydrofluoric acid or ammonium fluoride or exposed to a plasma containing fluorine as a source gas so as to fluorinate the surface of the film 1 to be processed.

Also, it is possible to form a contact angle buffering film as the adhesion improving film 2 on the film 1 to be processed by the hydrophobic treatment. It is desirable for the hydrophobic nature of the contact angle buffering film to be higher than that of the film 1 to be processed, i.e., θ1>θ2, where θ1 denotes the contact angle of the contact angle buffering film with pure water, and θ2 denotes the contact angle of the film 1 with the pure water. It is desirable for the contact angle with the pure water to be at least 40°. If the contact angle is smaller than 40°, a sufficient adhesion cannot be obtained between the film 1 to be processed and the mask material, with the result that the mask material pattern is ruptured during the etching process of the film 1 to be processed. Also, it is possible for the contact angle to be not smaller than 20° and smaller than 40° as described above.

It is possible for the contact angle buffering film to be formed of, for example, a novolak resin, a phenolic resin such as polyhydroxy styrene, polysulfone, polymethacrylate, or polyacrylate. It is possible for these materials to have a functional group so as to be substituted or not to have a functional group so as not to be substituted.

Also, it is possible to use as the contact angle buffering film a coating type organic antireflection film for an ultraviolet lithography using a KrF excimer laser or an ArF excimer laser as the light source. For example, it is possible to use AR3, AR5, AR15, AR19 manufactured by Shipley Inc. or DUV11 manufactured by Brewer Science Inc.

Figure 1B:
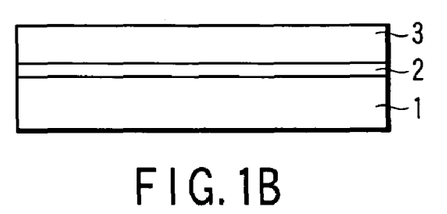

In the next step, a mask material 3 is formed on the adhesion improving region 2, as shown in FIG. 1B. It is desirable for the mask material 3 to have a thickness falling within a range of between 20 nm and 5,000 nm. If the thickness of the mask material 3 is smaller than 20 nm, the mask material 3 is scraped off during the etching process of the film 1 to be processed so as to make it difficult to process the film 1 to be processed at a desired size. On the other hand, if the thickness of the mask material 3 is larger than 5,000 nm, the CD loss is prominently generated when the pattern of the resist pattern is transferred onto the mask material 3 by the dry etching process.

It is desirable to employ a coating method for forming the mask material 3 because the coating method is simple in process and permits suppressing the process cost, compared with the CVD method. How to form the mask material 3 by the coating method will now be described in detail.

In the first step, a mask material solution is prepared by dissolving a compound having carbon atoms in an organic solvent. It is desirable for the molecular weight of the compound, which is not particularly limited, to fall within a range of between 200 and 100,000. If the molecular weight of the compound is smaller than 200, the mask material is dissolved in a solvent of a resist or an intermediate film. On the other hand, if the molecular weight exceeds 100,000, it is difficult for the compound to be dissolved in an organic solvent so as to make it difficult to prepare a mask material solution.

It is unnecessary for the compound having carbon atoms, which is used for preparing a mask material solution, to be limited to a single kind of the compound. It is possible to use a mixture of several kinds of compounds. Also, in order to improve the storage stability (stability during the storage within a bottle), it is possible to add desired a thermal polymerization inhibitor, an adhesion improving agent for improving the adhesion to the film 1 to be processed, a dye absorbing the ultraviolet light so as to prevent the light from being reflected from the film 1 to be processed into the resist, a polymer absorbing the ultraviolet light such as polysulfone or polybenzimidazol, an electrically conductive substance, a substance that is rendered conductive by the light or heat, or a crosslinking agent capable of crosslinking the metal compound.

The organic solvent used for preparing the mask material solution, which is not particularly limited in the present invention, includes, for example, a ketone series solvent such as acetone, methyl ethyl ketone, methyl isobutyl ketone, or cyclohexanone; a cellosolve series solvent such as methyl cellosolve, methyl cellosolve acetate, or ethyl cellosolve acetate; an ester series solvent such as ethyl lactate, ethyl acetate, butyl acetate, or isoamyl acetate; an alcoholic solvent such as methanol, ethanol or isopropanol; and other solvents such as anisole, toluene, xylene or naphtha.

After preparation of the coating material solution by the method described above, the film 1 to be processed is coated by, for example, a spin coating method with the coating material solution, followed by heating the coating so as to evaporate the solvent and, thus, to form the mask material 3.

It is desirable for the mask material 3 after the heating to have a carbon content not lower than 80 wt % by weight, more desirably not lower than 90 wt % by weight. If the carbon content is lower than 80 wt %, the mask material 3 fails to exhibit a sufficient resistance to the etching in the etching stage of the film 1 to be processed.

Figure 1C:
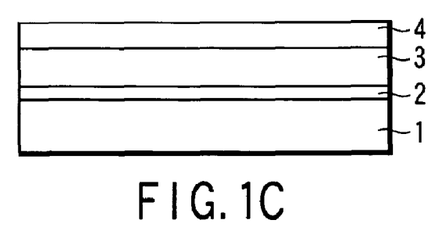

After formation of the mask material 3, an intermediate film 4 is formed on the mask material 3, as shown in FIG. 1C. It is desirable for the inter-mediate film 4 to have a thickness falling within a range of between 10 nm and 1,000 nm. If the thickness of the intermediate film 4 is smaller than 10 nm, the intermediate film 4 is scraped off during the etching process of the mask material 3. On the other hand, if the thickness of the intermediate film 4 exceeds 1,000 nm, it is difficult to process the intermediate film 4.

The material of the intermediate film 4, which is not particularly limited as far as the material contains a component that is not evaporated upon exposure to the oxygen plasma used in the etching stage of the mask material 3, includes a semiconductor oxide and a metal oxide. To be more specific, the inter-mediate film 4 is formed of, for example, silicon oxide, germanium oxide, aluminum oxide, titanium oxide or tungsten oxide.

It is desirable for the intermediate film 4 to be formed by the coating method. To be more specific, the mask material 3 is coated with a coating material (solution material) prepared by dissolving the compound containing semiconductor oxide or the compound containing metal oxide represented by chemical formula 1 or 2 given below in an organic solvent. The coating is performed by, for example, a spin coating method, followed by heating the coated solution material so as to evaporate the solvent contained in the solution material.

(1-1)

(1-2)

(1-3)

(1-4)

(1-5)

(1-6)

(1-7)

(2-1)

(2-2)

(2-3)

(2-4)

The organic solvent used for preparing the solution material noted above includes, for example, a ketone series solvent such as acetone, methyl ethyl ketone, methyl isobutyl ketone, or cyclohexanone; a cellosolve series solvent such as methyl cellosolve, methyl cellosolve acetate, or ethyl cellosolve acetate; an ester series solvent such as ethyl lactate, ethyl acetate, butyl acetate, or isoamyl acetate; an alcoholic solvent such as methanol, ethanol or isopropanol; and other solvent such as anisole, toluene, xylene or naphtha.

Figure 1D:
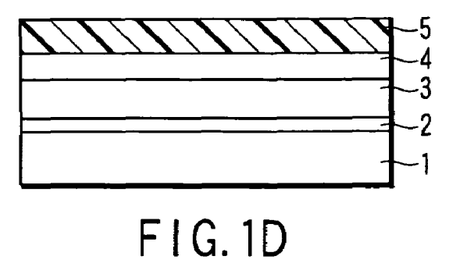

In the next step, a resist film 5 forming a resist pattern is formed by coating the intermediate film 4 with a resist solution, followed by applying a heat treatment to the coated resist solution, as shown in FIG. 1D. If the thickness of the resist film 5 is decreased, it is possible to improve the exposure latitude and the focus latitude in the light exposure stage and to improve the resolution. Such being the situation, it is desirable for the thickness of the resist film 5 to be as small as possible, as far as the mask material 3 and the intermediate film 4 can be etched with a good size controllability. To be more specific, it is desirable for the thickness of the resist film 5 to fall within a range of between 10 nm and 10,000 nm.

The type of the resist film 5 is not particularly limited. It is possible to use a posi type or a nega type resist film in accordance with the purpose.

To be more specific, the positive type resist used for forming the resist film 5 includes, for example, IX-770 (trade name of a resist formed of naphthoquinone diazide and novolak resin and manufactured by JSR Corp.) and APEX-E (trade name of a chemical amplification type resist formed of a polyvinyl phenolic resin protected by t-BOC and an acid generating agent, and manufactured by Shipley Inc.).

On the other hand, the negative type resist used for forming the resist film 5 includes, for example, SNR200 (trade name of a chemical amplification type resist formed of polyvinyl phenol, melamine resin, and a photoacid generator and manufactured by Shipley Inc.) and RD-2000N (trade name of a resist formed of polyvinyl phenol and a bis-azide compound and manufactured by Hitachi Kasei K. K.). Of course, the positive type resist and the negative type resist used for forming the resist film 5 are noted limited to the resists exemplified above.

Then, the intermediate film 4 is coated with a solution containing the resist (resist solution) by, for example, a spin coating method or a dipping method, followed by heating the coated solution so as to evaporate the solvent, thereby forming the resist film 5.

The light source used for the light exposure treatment, which is not particularly limited in the present invention, includes, for example, an ultraviolet light, an X-ray, an electron beam, and an ion beam. The ultraviolet light noted above includes, for example, a g-line of a mercury lamp having a wavelength of 436 nm, an i-line of a mercury lamp having a wavelength of 365 nm, and excimer lasers such as a XeF excimer laser having a wavelength of 351 nm, a XeCl excimer laser having a wavelength of 308 nm, a KrF excimer laser having a wavelength of 248 nm, a KrCl excimer laser having a wavelength of 222 nm, an ArF excimer laser having a wavelength of 193 nm, and a $F_2$ excimer laser having a wavelength of 157 nm.

Figure 1E:
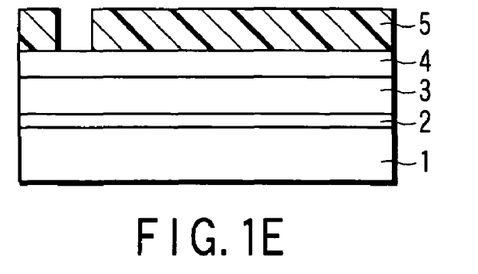

In the next step, a resist pattern 5 is formed by the application of a developing treatment with an alkali developing solution such as THAM or choline, as shown in FIG. 1E. The resist pattern 5 includes open portions corresponding to, for example, trenches such as a capacitor trench and an element isolating trench (STI), connecting holes-such as a contact hole and a via hole, and a wiring groove for a damascene wiring.

Also, it is possible to form as desired an upper layer antireflection film on the resist film 5 in order to decrease the multiple reflection within the resist film 5 during the light exposure treatment, or to form an upper layer antistatic film on the resist film 5 in order to prevent the charge-up during the electron beam exposure treatment.

Figure 1F:
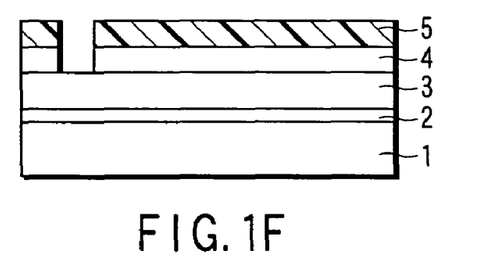

After formation of the resist pattern 5, the intermediate film 4 is subjected to a dry etching process with the resist pattern 5 used as a mask so as to transfer the pattern of the resist pattern 5 onto the intermediate film 4, as shown in FIG. 1F. The intermediate film 4 having the pattern of the resist pattern 5 transferred thereonto is called an intermediate film pattern 4 in the following description.

The etching process employed in this stage, which is not particularly limited as far as a fine processing can be performed, includes, for example, a reactive ion etching (RIE) process, a magnetron type reactive ion etching process, an electron beam ion etching process, an ICP etching process and an ECR ion etching process.

Figure 1G:
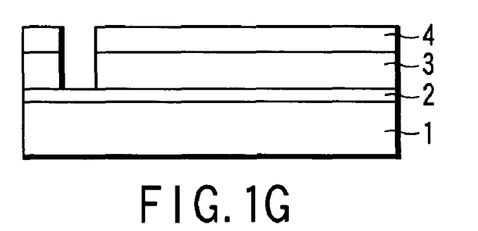

In the next step, the mask material 3 is subjected to a dry etching process with the resist pattern 5 and the intermediate film pattern 4 used as a mask so as to transfer the pattern of the intermediate film pattern 4 onto the mask material 3, as shown in FIG. 1G. The mask material 3 having the pattern of the intermediate film pattern 4 transferred thereto is called a mask material pattern 3 in the following description.

FIG. 1G covers the case where the resist pattern 5 has disappeared during the etching process of the mask material 3. However, it is possible for the resist pattern 5 to be left unremoved. Where the resist pattern 5 has disappeared, the mask material 3 is selectively etched with the intermediate film pattern 4 used as a mask.

The etching process employed in this stage, which is not particularly limited as far as it is possible to carry out a fine processing, includes, for example, RIE method, a magnetron type reactive ion etching process, an electron beam ion etching process, an ICP etching process and an ECR ion etching process. However, it is desirable to use an oxygen-based gas, a nitrogen-based gas or a chlorine-based gas as the source gas in order to process the mask material 3 with a good anisotropy.

Figure 1H:
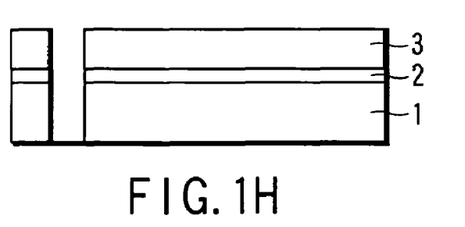

Finally, the film 1 to be processed is subjected to a dry etching process with the mask material pattern 3 used as a mask so as to transfer the pattern of the mask material pattern 3 onto the film 1 to be processed.

The etching process employed in this stage, which is not particularly limited as far as it is possible to carry out a fine processing, includes, for example, RIE method, a magnetron type reactive ion etching process, an electron beam ion etching process, an ICP etching process and an ECR ion etching process.

As a result of an extensive research conducted by the present inventors, it has been clarified that, in the case of using a fluorocarbon series gas as the source gas, a fluorocarbon series polymer film is deposited on the surface of the mask material pattern 3. In this case, the etching gas tends to be accumulated at the interface between the mask material pattern 3 and the film 1 to be processed, with the result that the mask material pattern 3 tends to be ruptured. Particularly, it has been found that, in the case of forming a trench having a depth not smaller than 1 μm, e.g., a capacitor trench, on the surface of the semiconductor substrate (working film to be processed), the mask material pattern 3 tends to be ruptured more easily. Such being the situation, the first embodiment of the present invention tends to produce a desired effect easily in the case of using a fluorocarbon series gas as the source gas.

The description given above covers the case where the pattern of the resist pattern 5 is transferred onto the mask material 3 via the intermediate film 4. However, it is also possible to transfer the pattern of the resist pattern 5 directly onto the mask material 3 without using the intermediate film 4.

In this case, in order to ensure a desirable etching selectivity ratio between the resist pattern 5 and the mask material 3, a silicon-containing resist can be used suitably as the resist material. A suitable silicon-containing resist material is available on the market including, for example, KRF B10B (trade name, manufactured by JSR Corp.) and TIS22001L (trade name, manufactured by Fuji Film Arch Inc.). The pattern of the resist pattern 5 can be transferred onto the mask material 3 as in the transfer of the pattern of the intermediate film pattern 4 onto the mask material 3.

According to the first embodiment described above, the adhesion improving layer 2 is formed on the film 1 to be processed so as to improve the adhesion between the film 1 to be processed and the mask material pattern 3. As a result, it is possible to prevent effectively the mask material pattern 3 from being ruptured during the etching process of the film 1 to be processed.

(Second Embodiment)

FIGS. 2A to 2H are cross sectional views showing a manufacturing process of a semiconductor device according to the second embodiment of the present invention.

Figure 2A:
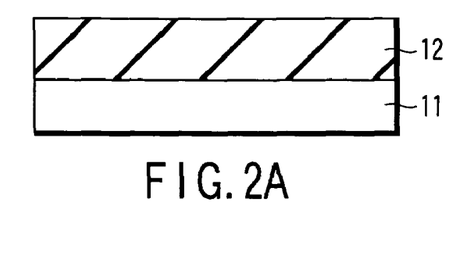
FIGS. 2A to 2H are cross sectional views showing a manufacturing process of a semiconductor device for a second embodiment of the present invention.

In the first step, a TEOS oxide film 12 is formed on a silicon substrate 11 in a thickness of 700 nm by an LPCVF process, as shown in FIG. 2A.

Figure 2B:
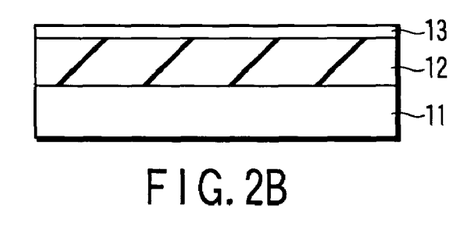

Then, an adhesion improving region 13 is formed on the TEOS oxide film 12 in order to improve the adhesion between the TEOS oxide film 12 and a mask material formed in the subsequent step on the TEOS oxide film 12, as shown in FIG. 2B.

Processes P1 to P6 given below were selected for forming the adhesion improving region 13. For comparison, also prepared was a sample (sample R) on which the adhesion improving region 13 was not formed.

P1: The silicon substrate 11 having the TEOS oxide film 12 formed thereon was exposed for 15 seconds to a hexamethyl disilazane atmosphere while heating the silicon substrate 11 to 100° C. so as to form an adhesion improving region 13 by modifying the surface of the TEOS oxide film 12. The sample having the adhesion improving region 13 formed thereon by process P1 is called herein sample S1.

P2: The silicon substrate 11 was exposed to the hexamethyl disilazane atmosphere for 30 seconds in process P1. The sample having the adhesion improving region 13 formed thereon by process P2 is called herein sample S2.

P3: The silicon substrate 11 was exposed to the hexamethyl disilazane atmosphere for 60 seconds in process P1. The sample having the adhesion improving region 13 formed thereon by process P3 is called herein sample S3.

P4: A fluorocarbon film (contact angle buffering film) was formed on the TEOS oxide film 12 in a thickness of 10 nm as the adhesion improving region 13 by using a CVD apparatus under the conditions that the flow rate of $C_4F_8$ was set at 200 sccm, the substrate temperature was set at 60° C., and the exciting power density was set at 1.5 W/cm$^2$. The composition of the fluorocarbon film identified by the XPS spectrometry was found to be $C_3F_8$. The sample having the adhesion improving region 13 formed thereon by process P4 is called herein sample S4.

P5: A fluorinated oxide film (contact angle buffering film) was formed in a thickness of 10 nm as the adhesion improving region 13 on the TEOS oxide film 12 in direct contact with the TEOS oxide film 12 by using an LPCVD apparatus having the TEOS oxide film 12 formed therein. The composition of the fluorinated oxide film identified by the XPS spectrometry was found to be $SiO_{1.7}F_{0.2}$. The sample having the adhesion improving region 13 formed thereon by process P5 is called herein sample S5.

P6: A coating type antireflection film manufactured by Shipley Inc. (hereinafter referred to as AR5) was formed by a spin coating method, followed by baking the antireflection film at 200° C. for 90 seconds so as to form AR5 as the adhesion improving region 13 on the TEOS oxide film 12. AR5 after the baking treatment was found to have a thickness of 50 nm. The sample having the adhesion improving region 13 formed thereon by process P6 is called herein sample S6.

The contact angle of the adhesion improving region 13 with the pure water for each of sample S1 to S7 and the contact angle of the TEOS oxide film 12 with the pure water for sample R were measured, with the results as shown in Table 1.

TABLE 1

| Sample | Contact angle (°) | Etching time | | | |
|---|---|---|---|---|---|
| | | 30 seconds | 36 seconds | 42 seconds | 48 seconds |
| R | 10 | NG | NG | NG | NG |
| S1 | 43 | OK | OK | NG | NG |
| S2 | 54 | OK | OK | OK | OK |
| S3 | 60 | OK | OK | OK | OK |
| S4 | 68 | OK | OK | OK | OK |
| S5 | 69 | OK | OK | OK | OK |
| S6 | 59 | OK | OK | OK | OK |

As shown in Table 1, the contact angle for each of samples S1 to S6 was found to be larger than 400, supporting that the hydrophobic nature was sufficiently improved for each of samples S1 to S6, compared with sample R.

Figure 2C:
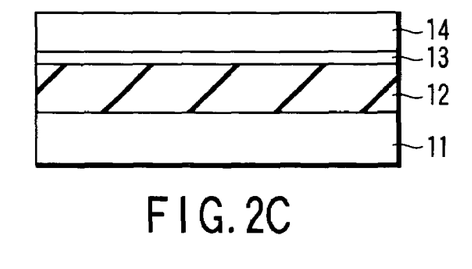

In the next step, the surface of the adhesion improving layer 13 was coated by the spin coating method with a mask material solution prepared by dissolving 10 g of polyarylene having an average weight molecular weight of 2,000 in 90 g of cyclohexanone, followed by baking the coated mask material solution at 180° C. for 60 seconds and, then, at 300° C. for 60 seconds so as to form a mask material 14 having a thickness of 300 nm on the adhesion improving region 13 as shown in FIG. 2C.

Incidentally, the carbon content of the mask material 14 after the baking treatment was analyzed by the elemental analysis method and the XPS spectrometry, with the result that the amount of the carbon atoms contained in the mask material 14 was found to be 82 wt %.

Figure 2D:
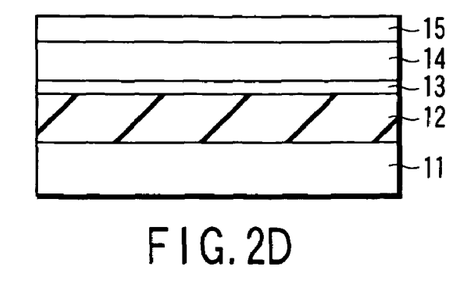

Then, the mask material 14 was coated by a spin coating method with an intermediate film solution prepared by dissolving 10 g of polymethyl siloxane having an average weight molecular weight of 2,000 in 90 g of polyglycol propyl ether, followed by baking the coated solution at 180° C. for 60 seconds and, then, at 300° C. for 60 seconds so as to form an intermediate film 15 having a thickness of 45 nm on the mask material 14, as shown in FIG. 2D.

Figure 2E:
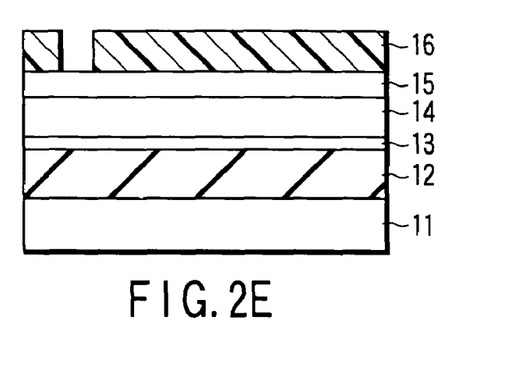

Further, the intermediate film 15 was coated by a spin coating method with ARFO11J (trade name of ArF resist manufactured by JSR Inc.), followed by applying a baking treatment to the coated resist film at 140° C. for 90 seconds and, then, applying a patterned light exposure to the baked resist film by using an ArF light exposure device having NA of 0.68 (NA=0.68). Still further, after the baking treatment at 140° C. for 90 seconds, a developing treatment was applied by using a TMAH developing solution of 0.21N so as to form a resist pattern 16 including a contact hole having a diameter of 150 nm on the mask material 14, as shown in FIG. 2E.

Figure 2F:
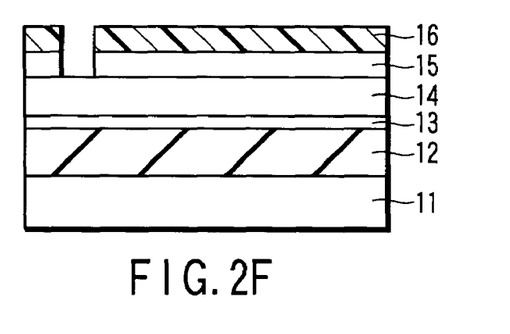

In the next step, the intermediate film 15 was selectively etched by using a RIE tool with the resist pattern 16 used as a mask under the conditions that the flow rates of the source gas $CF_4/O_2/Ar$ were set at 10/80/100 sccm, the substrate temperature was set at 60° C., and the exciting power density was set at 1.5 W/cm² so as to transfer the pattern of the resist pattern 16 onto the intermediate film 15 as shown in FIG. 2F. The intermediate film 15 having the pattern of the resist pattern 16 transferred thereonto is called an intermediate film pattern 15 in the following description.

Figure 2G:
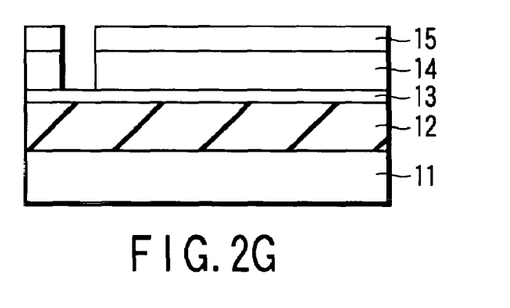

Further, the mask material 14 was selectively etched by using a RIE tool with the resist pattern 16 and the intermediate film pattern 15 used as a mask under the conditions that the flow rates of the source $O_2/Ar$ were set at 10/80 sccm, the substrate temperature was set at 60° C., and the exciting power density was set at 1.5 W/cm² so as to transfer the pattern of the intermediate film pattern 15 onto the mask material 14 as shown in FIG. 2G. The mask material 14 having the pattern of the intermediate film pattern 15 transferred thereonto is called a mask material pattern 14 in the following description.

FIG. 2G covers the case where the resist pattern 16 has disappeared during the etching process of the mask material 14. However, it is possible for the resist pattern 16 to be left unremoved. Where the resist pattern 16 has disappeared, the mask material 14 is selectively etched with the intermediate film pattern 15 used as a mask.

Figure 2H:
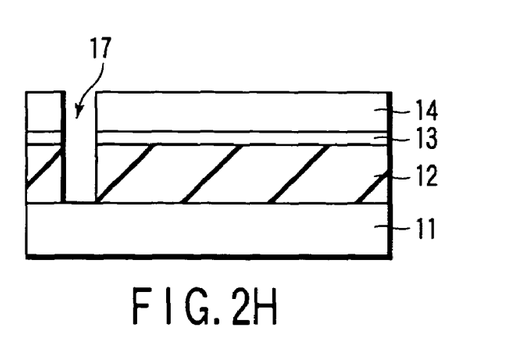

In the next step, the TEOS oxide film 12 and the adhesion improving region 13 were selectively etched by using a RIE tool with the mask material pattern 14 used as a mask under the conditions that the flow rates of the source gas $C_4F_8/CO/O_2/Ar$ was set at 10/10/10/80 sccm, the substrate temperature was set at 60° C., and the exciting power density was set at 1.5 W/cm² so as to form a contact hole 17 in the TEOS oxide film 12, as shown in FIG. 2H. In this case, the etching process was performed for 30 seconds, which was determined by detecting the end point based on the light emission.

Figure 3:
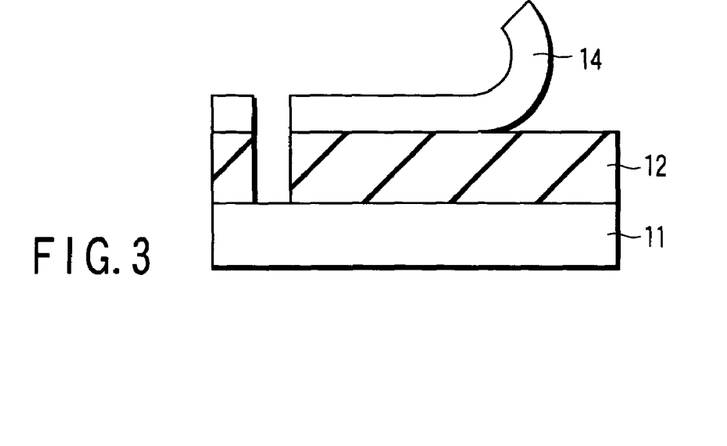
FIG. 3 is a cross sectional view showing a sample for a comparative example in which the mask material pattern has been ruptured.

In sample R in which the adhesion improving region 13 was not formed, the mask material pattern 14 was ruptured as shown in FIG. 3. However, the rupture was not recognized in any of samples S1 to S6 in which the adhesion improving region 13 was formed.

It is considered reasonable to understand that the mask material pattern 14 was ruptured in sample R because the source gas was accumulated at the interface between the TEOS oxide film 12 and the mask material pattern 14 in the etching stage of the TEOS oxide film 12. To be more specific, since the adhesion between the TEOS oxide film 12 and the mask material pattern 14 was low in sample R, the source gas accumulated at the interface noted above caused the mask material pattern 14 to be ruptured.

In the process shown in FIG. 2H, the etching was performed for a time longer than 30 seconds so as to look into the rupture margin caused by the over-etching. The result of the evaluation is shown in Table 1 given previously. As apparent from Table 1, the rupture tends to be caused by the over-etching with decrease in the contact angle of each of the TEOS oxide film 12 and the adhesion improving region 13.

Where the contact angle of the mask material 14 with the pure water is set at 87°, each of the surface of the TEOS oxide film 12 and the adhesion improving region 13 tends to be wet with the mask material 13 with increase in the contact angle so as to produce a strong adhesion. As a result, it is considered reasonable to understand that the TEOS oxide film 12 is rendered less likely to be ruptured during the etching stage.

The adhesion between the TEOS oxide film 12 and the mask material pattern 14 can be increased by the presence of the adhesion improving region 13 in the second embodiment, too, as in the first embodiment described previously. It follows that it is possible to prevent effectively the mask material pattern 14 from being ruptured during the etching process of the TEOS oxide film 12.

(Third Embodiment)

FIGS. 4A to 4F are cross sectional views showing a manufacturing process of a semiconductor device according to the third embodiment of the present invention. Incidentally, those portions of FIGS. 4A to 4F which correspond to the portions shown in FIGS. 2A to 2H are denoted by the reference numerals equal to those used in FIGS. 2A to 2H so as to omit the detailed description thereof. In the second embodiment, an intermediate layer was formed between the TEOS oxide film and the mask material. In the third embodiment, however, the mask material is formed in direct contact with the TEOS oxide film.

Figure 4A:
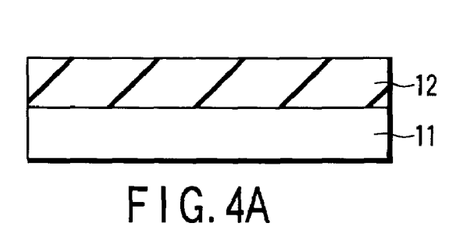
FIGS. 4A to 4F are cross sectional views showing a manufacturing process of a semiconductor device for a third embodiment of the present invention.
Figure 4B:
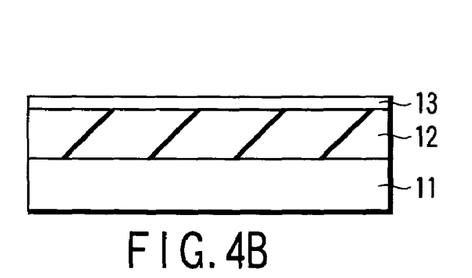

In the first step, a TEOS oxide film 12 having a thickness of 700 nm is formed on a silicon substrate 11 by a LPCVD process, as shown in FIG. 4A. Then, an adhesion improving region 13 is formed on the TEOS oxide film 12 as shown in FIG. 4B.

Processes P1 to P6 were selected for forming the adhesion improving region 13 as in the second embodiment. The samples having the adhesion improving region 13 formed therein by processes P1 to P6 are called samples S1 to S6, respectively, as in the second embodiment. Similarly, the sample having the adhesion improving region 13 not formed therein for comparison is called sample R.

Figure 4C:
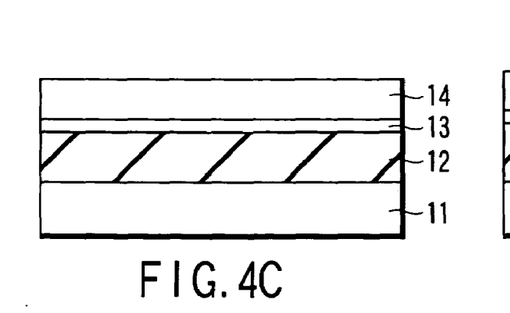
Figure 4D:
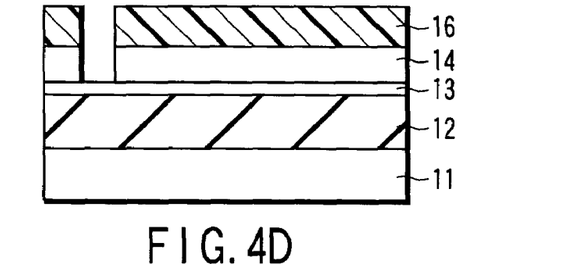

In the next step, a mask material 14 was formed on the adhesion improving region 13 as in the second embodiment, as shown in FIG. 4C. Then, the mask material 14 was coated by a spin coating method with ArF resist TIS22001L manufactured by Fuji Film Arch Inc. so as to form a resist film, followed by baking the resist film at 140° C. for 90 seconds. Further, a patterned light exposure was applied to the baked resist film by using an ArF light exposure apparatus having NA of 0.68 (NA=0.68). Then, the resist film was baked again at 140° C. for 90 seconds, followed by applying a developing treatment to the resist film with a TMAH developing solution of 0.21N so as to form a resist pattern 16 including a contact hole having a diameter of 150 nm, as shown in FIG. 2D.

Figure 4E:
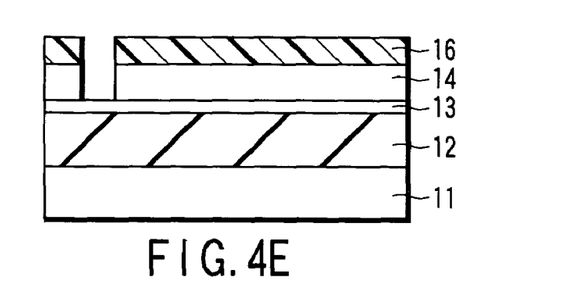

In the next step, the mask material 14 was selectively etched by using a RIE tool with the resist pattern 16 used as a mask under the conditions that the flow rates of the source $O_2$/Ar were set at 10/80 sccm, the substrate temperature was set at 60%, and the exciting power density was set at 1.5 W/cm$^2$ so as to transfer the pattern of the resist pattern 16 onto the mask material 14, as shown in FIG. 4E. The mask material having the pattern of the resist pattern 16 transferred thereonto is called a mask material pattern 14 in the following description.

Figure 4F:
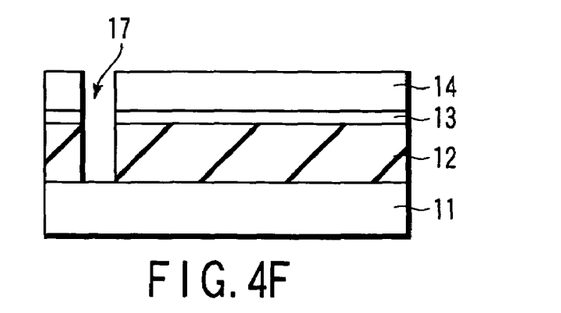

Further, the TEOS oxide film 12 and the adhesion improving region 13 were selectively etched by using a RIE tool under the conditions that the flow rates of the source gas $C_4F_8$/CO/$O_2$/Ar were set at 10/10/10/80, the substrate temperature was set at 60° C., and the exciting power density was set at 1.5 W/cm$^2$ so as to form a contact hole 17 in the TEOS oxide film 12, as shown in FIG. 4F. In this case, the etching was performed for 30 seconds, which was determined by the detection of the end point based on the light emission.

The mask material pattern 14 was ruptured in sample R in which the adhesion improving region was not formed, as in the second embodiment. However, the mask material pattern 14 was not ruptured in each of samples S1 to S6 having the adhesion improving region 13 formed therein. The reason for the rupture generation in sample R is considered to be equal to that described previously in conjunction with the second embodiment.

Also, the etching was performed for a time longer than 30 seconds so as to look into the rupture margin relative to the over-etching. It has been found that the rupture tends to be caused by the over-etching with decrease in the contact angle of each of the TEOS oxide film 12 and the adhesion improving region 13, as in the second embodiment. The reason for the particular situation is considered to be equal to that for the second embodiment.

The processes of the embodiments described previously can be applicable to variety of manufacturing method of semiconductor device. For instance, the processes are applicable to the manufacturing method of semiconductor memory. DRAM, EEPREOM (flash memory), FRAM, and MRAM are concrete examples of the semiconductor memory. The processes are further applicable to the semiconductor device comprising the semiconductor memory. The concrete examples of the semiconductor device are described below.

Figure 5:
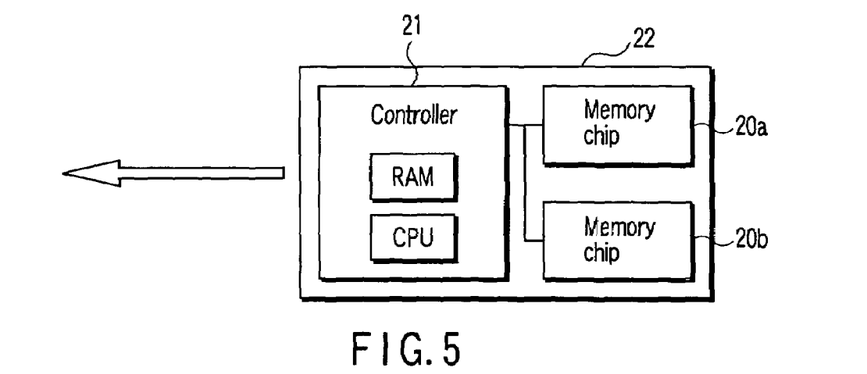
FIG. 5 schematically shows a memory card comprising a controller and an embedded chip.

FIG. 5 shows the construction of a memory card 22 equipped with a controller and an embedded chip. As shown in the drawing, a controller 21 and a plurality of memory chips 20a and 20b are mounted to the memory card 22. The host interface shown in FIG. 5 includes, for example, an ATA interface, a PC card interface and USB. It is possible to use another interface. The controller 21 includes a RAM and a CPU. It is possible for the controller 21 and the memory chips 20a, 20b to be formed in a single chip or in different chips.

Figure 6:
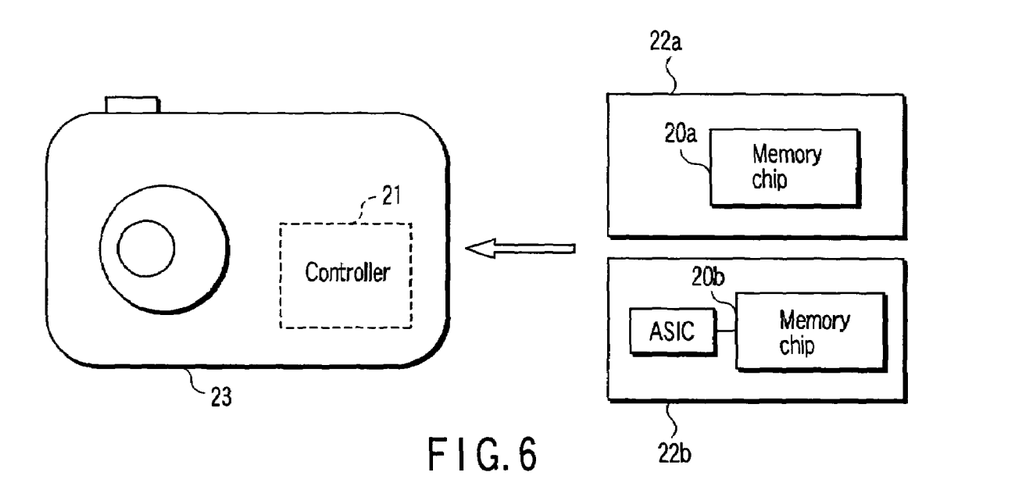
FIG. 6 schematically shows a memory card that is not equipped with a controller.

FIG. 6 shows a memory card 23 having a controller not mounted thereto. This example is directed to a card 22a having a memory chip 20a alone mounted thereto or to a card 22b having a logic circuit (ASIC) 24 of a relatively small scale mounted thereto. For example, a digital camera 23 constitutes the equipment on the side of the host having the card 22a, 22b connected thereto.

Figure 7:
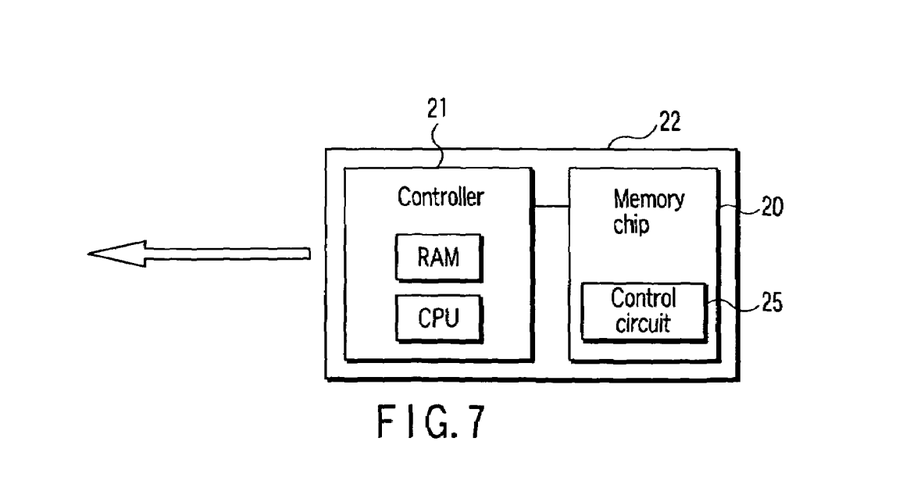
FIG. 7 schematically shows a memory chip equipped with a control circuit.

Further, FIG. 7 shows a memory chip having a control circuit mounted thereto. As shown in the drawing, a controller 21 and a memory chip 20 are mounted to the memory card 22. Further, the memory chip 20 includes a control circuit 25.

What is claimed is:

1. A method of manufacturing a semiconductor devices comprising:
   preparing a working film to be processed;
   forming an adhesion improving region on the working film for increasing an adhesion between the working film and a mask material;
   forming the mask material on the working film, wherein the mask material contains carbon in an amount of at least 80% by weight;
   forming a resist pattem on the mask material, the mask material having a higher etching resistance for the working film than the resist pattern;
   transferring the pattern of the resist pattern onto the mask material; and
   etching the working film by using the mask material as a mask.

2. The method of manufacturing a semiconductor device according to claim 1, wherein the forming the adhesion improving region comprises a hydrophobic treatment to render a surface of the working film to be hydrophobic.

3. The method of manufacturing a semiconductor device according to claim 2, wherein the hydrophobic treatment is carried out by using a silane coupling agent.

4. The method of manufacturing a semiconductor device according to claim 3, wherein the silane coupling agent is a hexamethyl disilazane.

5. The method of manufacturing a semiconductor device according to claim 2, wherein the hydrophobic treatment is carried out to permit the contact angle with pure water on the adhesion improving region to be at least 20°.

6. The method of manufacturing a semiconductor device according to claim 2, wherein the working film is selected from the group consisting of a silicon film, a silicon oxide film, a silicon nitride film, a silicon oxynitride film, and a silicon substrate.

7. The method of manufacturing a semiconductor device according to claim 2 further comprising forming an intermediate film on the mask material before forming the resist pattern, the transferring the pattern of the resist pattern onto the mask material comprising transferring a pattern of the resist pattem onto the intermediate film and transferring a pattern of the intermediate pattern onto the mask material.

8. The method of manufacturing a semiconductor device according to claim 2, wherein the etching the working film by using the mask material as the mask comprises etching the working film by a dry etching process using a fluorocarbon series gas.

9. The method of manufacturing a semiconductor device according to claim 1, wherein the forming the adhesion improving region comprises forming a film for improving the adhesion between the working film and the mask material on the working film.

10. The method of manufacturing a semiconductor device according to claim 9, wherein the film for increasing the adhesion between the working film and the mask material and the working film satisfy a condition of $\theta1<\theta2$, where $\theta1$ denotes a contact angle with pure water of the film for increasing the adhesion between the working film and the mask material for pure water, and $\theta2$ denotes a contact angle with the pure water of the working film.

11. The method of manufacturing a semiconductor device according to claim 1, wherein the working film is selected from the group consisting of a silicon film, a silicon oxide film, a silicon nitride film, a silicon oxynitride film, and a silicon substrate.

12. The method of manufacturing a semiconductor device according to claim 1 further comprising forming an intermediate film on the mask material before forming the resist pattern, the transferring the pattern of the resist pattern onto the mask material comprising transferring a pattern of the resist pattern onto the intermediate film and transferring a pattern of the intermediate pattern onto the mask material.

13. The method of manufacturing a semiconductor device according to claim 1, wherein the etching the working film by using the mask material as the mask comprises etching the working film by a dry etching process using a fluorocarbon series gas.

* * * * *